(12) United States Patent
Matsuda et al.

(10) Patent No.: US 12,191,553 B2
(45) Date of Patent: Jan. 7, 2025

(54) TRANSMISSION LINE

(71) Applicant: Murata Manufacturing Co., Ltd., Nagaokakyo (JP)

(72) Inventors: Kenji Matsuda, Nagaokakyo (JP); Takuya Hashimoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 258 days.

(21) Appl. No.: 17/983,444

(22) Filed: Nov. 9, 2022

(65) Prior Publication Data

US 2023/0066411 A1 Mar. 2, 2023

Related U.S. Application Data

(63) Continuation of application No. PCT/JP2021/017809, filed on May 11, 2021.

(30) Foreign Application Priority Data

May 15, 2020 (JP) ................................. 2020-085754

(51) Int. Cl.
*H01P 3/08* (2006.01)
*H01P 3/02* (2006.01)
(Continued)

(52) U.S. Cl.
CPC ................ *H01P 3/08* (2013.01); *H01P 3/026* (2013.01); *H01Q 1/48* (2013.01); *H05K 1/028* (2013.01)

(58) Field of Classification Search
CPC ............... H05K 1/0216; H05K 1/0296; H05K 2201/09281; H05K 1/028; H01Q 1/48; H01P 3/08; H01P 3/026; H01P 3/00
See application file for complete search history.

(56) References Cited

U.S. PATENT DOCUMENTS

2004/0257178 A1* 12/2004 Shimoda .............. H05K 1/0251
333/238
2007/0241447 A1 10/2007 Cheung et al.
(Continued)

FOREIGN PATENT DOCUMENTS

JP 2002184898 A 6/2002
JP 2006120873 A 5/2006
(Continued)

OTHER PUBLICATIONS

International Search Report in PCT/JP2021/017809, mailed Jul. 20, 2021, 3 pages.
(Continued)

*Primary Examiner* — Quan Tra
(74) *Attorney, Agent, or Firm* — Keating & Bennett, LLP

(57) ABSTRACT

A transmission line includes a substrate including insulator layers, a mounting electrode on a front layer of the substrate, a signal conductor, a first ground conductor, a first connecting electrode that electrically connects the mounting electrode and the signal conductor and is between the signal conductor and the first ground conductor in a laminating direction, a first inter-layer connecting conductor that is electrically connected between the mounting electrode and the first connecting electrode and is bonded to the first connecting electrode, and a second inter-layer connecting conductor that is electrically connected between the signal conductor and the first connecting electrode, is bonded to the first connecting electrode, and does not overlap with the first inter-layer connecting conductor when viewed in the laminating direction. The first ground conductor does not overlap with at least a portion of the first connecting electrode when viewed in the laminating direction.

20 Claims, 10 Drawing Sheets

(51) Int. Cl.
*H01Q 1/48* (2006.01)
*H05K 1/02* (2006.01)

(56) References Cited

U.S. PATENT DOCUMENTS

| | | |
|---|---|---|
| 2015/0180125 A1 | 6/2015 | Ishizuka et al. |
| 2017/0149111 A1 | 5/2017 | Yosui et al. |
| 2017/0279177 A1 | 9/2017 | Oguri et al. |
| 2020/0267832 A1* | 8/2020 | Koyama ............... H05K 1/0219 |
| 2021/0013608 A1 | 1/2021 | Takayama et al. |
| 2022/0200116 A1* | 6/2022 | Ikemoto ................ H01P 3/088 |
| 2022/0200118 A1* | 6/2022 | Nagai .................... H01P 5/022 |

FOREIGN PATENT DOCUMENTS

| | | |
|---|---|---|
| JP | 2007287916 A | 11/2007 |
| JP | 2009004809 A | 1/2009 |
| JP | 2013030516 A | 2/2013 |
| JP | 2019106680 A | 6/2019 |
| NO | 2019189050 A1 | 10/2019 |
| WO | 2014050238 A1 | 4/2014 |
| WO | 2016163436 A1 | 10/2016 |
| WO | 2017051649 A1 | 3/2017 |

OTHER PUBLICATIONS

Written Opinion in PCT/JP2021/017809, mailed Jul. 20, 2021, 3 pages.

* cited by examiner

TRANSMISSION LINE

CROSS REFERENCE TO RELATED APPLICATIONS

This application claims the benefit of priority to Japanese Patent Application No. 2020-085754 filed on May 15, 2020 and is a Continuation Application of PCT Application No. PCT/JP2021/017809 filed on May 11, 2021. The entire contents of each application are hereby incorporated herein by reference.

BACKGROUND OF THE INVENTION

1. Field of the Invention

The present invention relates to a transmission line included in a substrate.

2. Description of the Related Art

Examples of a conventional transmission line include the signal transmission line described in International Publication No. 2016/163436. This signal transmission line includes a laminated insulator, a signal conductor pattern, and two ground conductor patterns. The laminated insulator is composed of a plurality of insulator layers that are laminated. The signal conductor pattern and the ground conductor patterns are formed in the laminated insulator. The signal conductor pattern is arranged between the ground conductor patterns.

In the signal transmission line described in International Publication No. 2016/163436, inter-layer connecting conductors are arranged in series below a mounting electrode on which an electronic component is mounted and accordingly, flatness of the mounting electrode may be degraded. Mounting electrodes preferably have higher flatness so as to realize favorable connection on the mounting electrodes. However, if a conductor pattern is used for maintaining flatness of mounting electrodes, deviation of characteristic impedance may occur on the other hand.

SUMMARY OF THE INVENTION

Preferred embodiments of the present invention provide transmission lines that each maintain flatness of a mounting electrode, and reduce or prevent deviation of characteristic impedance.

A transmission line according to a preferred embodiment of the present invention includes a substrate including a plurality of insulator layers, a mounting electrode on a front layer of the substrate, a signal conductor in the substrate, a first ground conductor on the substrate and overlapping with the signal conductor when viewed in a laminating direction of the plurality of insulator layers, a first connecting electrode that electrically connects the mounting electrode and the signal conductor with each other and is between the signal conductor and the first ground conductor in the laminating direction, a first inter-layer connecting conductor that is electrically connected between the mounting electrode and the first connecting electrode and is bonded to the first connecting electrode, and a second inter-layer connecting conductor that is electrically connected between the signal conductor and the first connecting electrode, is bonded to the first connecting electrode, and does not overlap with the first inter-layer connecting conductor when viewed in the laminating direction. The first ground conductor does not overlap with at least a portion of the first connecting electrode when viewed in the laminating direction.

According to preferred embodiments of the present invention, flatness of a mounting electrode is maintained and deviation of characteristic impedance in a transmission line is reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A plurality of preferred embodiments of the present invention will be shown below. Each of the preferred embodiments is exemplary and partial substitution or combination of configurations described in different preferred embodiments can be performed. Each preferred embodiment will provide description on points that differ from points described before that preferred embodiment. In particular, the same advantageous effects obtained from the same configuration will not be sequentially mentioned in each preferred embodiment.

First Preferred Embodiment

Figure 1:
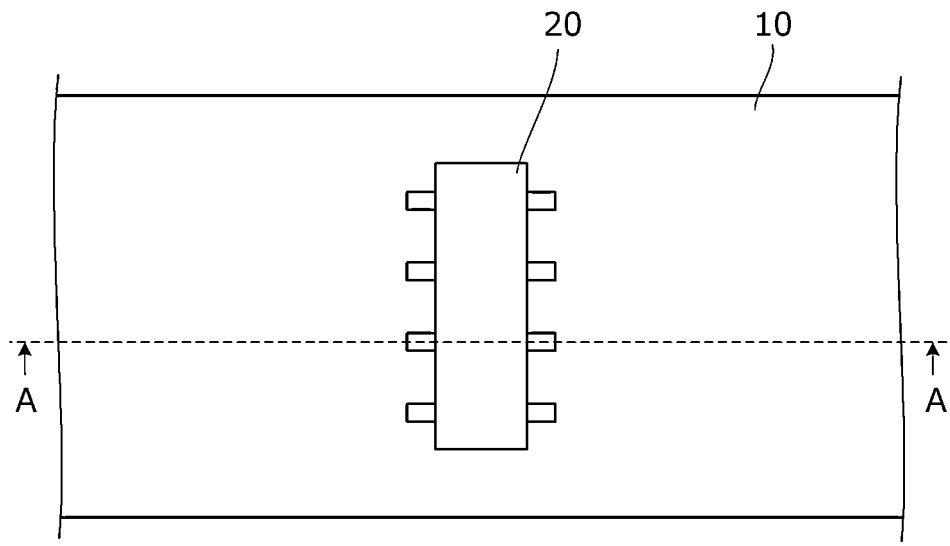
FIG. 1 is a plan view of a transmission line 10 according to a first preferred embodiment of the present invention.
Figure 2:
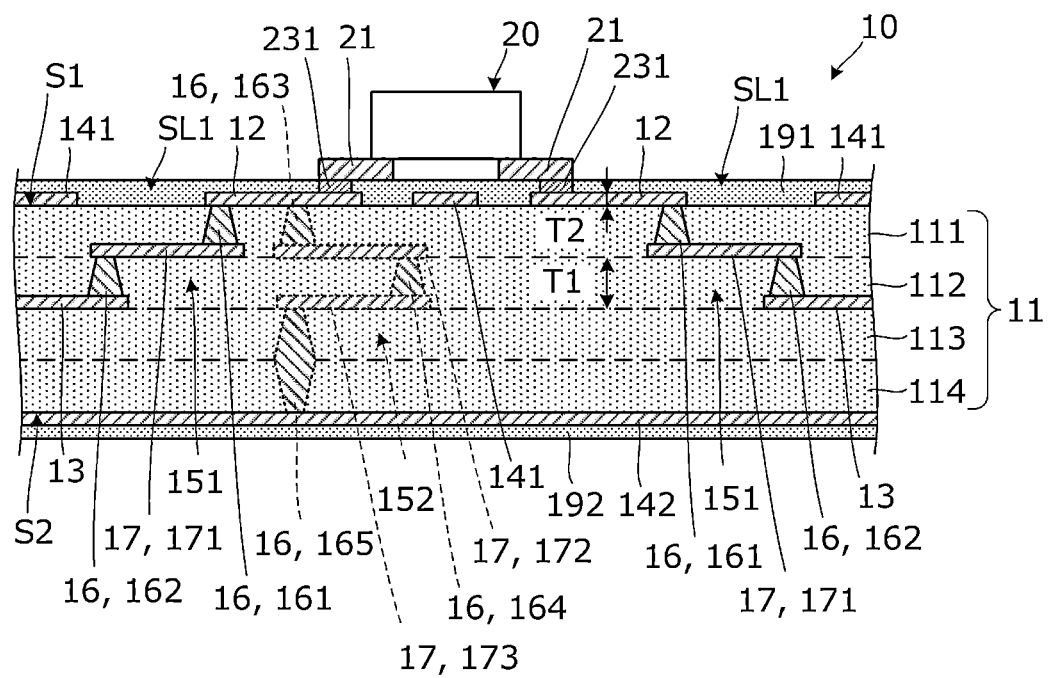
FIG. 2 is an A-A sectional view of the transmission line 10.
Figure 3:
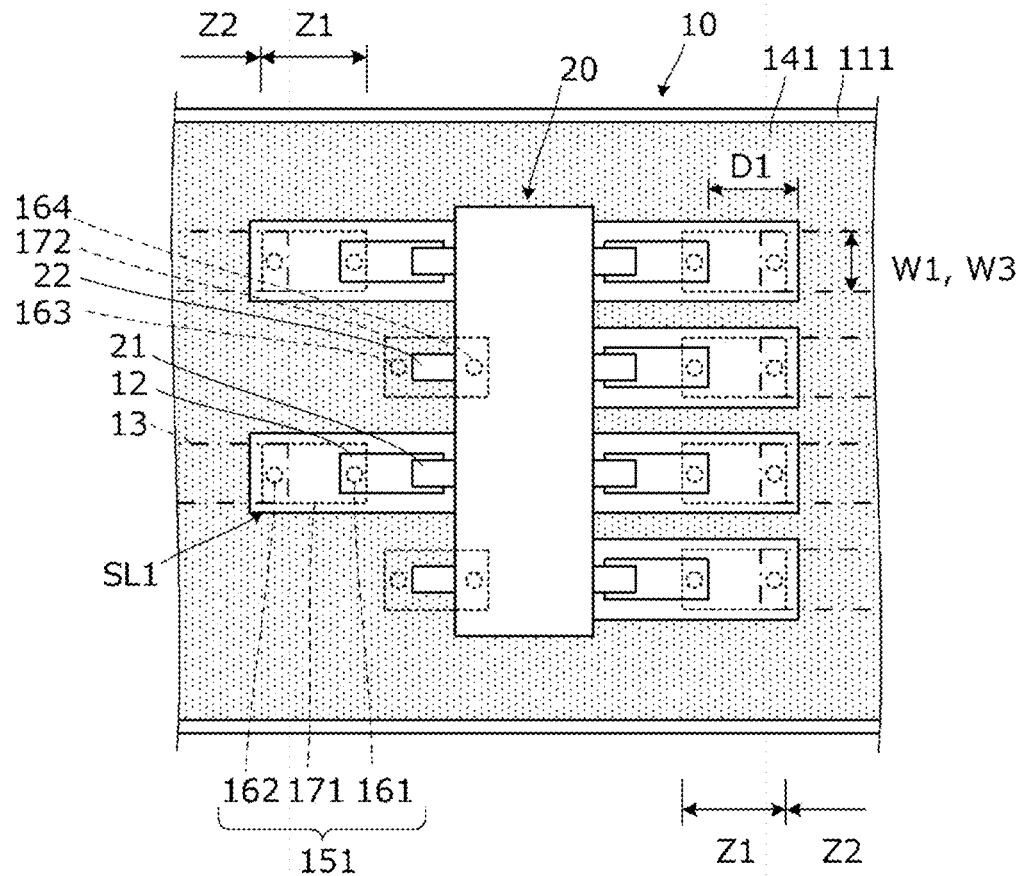
FIG. 3 is a plan view of a main portion of the transmission line 10.

FIG. 1 is a plan view of a transmission line 10 according to a first preferred embodiment of the present invention. FIG. 2 is an A-A sectional view of the transmission line 10. FIG. 3 is a plan view of a main portion of the transmission line 10. FIG. 3 omits the illustration of a resist film 191.

The transmission line 10 has a planar shape and extends in one direction. The transmission line 10 includes a substrate 11, a mounting electrode 12, a signal conductor 13, ground conductors 141 and 142, inter-layer connecting conductors 16, and connecting electrodes 17. The connecting electrodes 17 include a first connecting electrode 171 and second connecting electrodes 172 and 173. The inter-layer connecting conductors 16 include a first inter-layer connecting conductor 161, a second inter-layer connecting conductor 162, and inter-layer connecting conductors 163, 164, and 165. The ground conductor 141 is an example of a "first ground conductor". The ground conductor 142 is an example of a "second ground conductor". An electronic component 20 is mounted on a first main surface S1 of the substrate 11. The electronic component 20 includes a connection terminal (signal terminal) 21 and a connection terminal (ground terminal) 22 that are aligned.

The transmission line 10 includes a connecting portion 151 that connects the mounting electrode 12 and the signal conductor 13 with each other, and a connecting portion 152 that connects the ground conductor 141 and the ground conductor 142 with each other. The connecting portion 151 includes the first inter-layer connecting conductor 161, the second inter-layer connecting conductor 162, and the first connecting electrode 171. The connecting portion 152 includes the inter-layer connecting conductors 163, 164, and 165 and the second connecting electrodes 172 and 173. The transmission line 10 includes a first region Z1 in which the connecting portion 151 is provided and a second region Z2 in which the signal conductor 13 is provided.

The substrate 11 includes a plurality of insulator layers 111, 112, 113, and 114 that are laminated. The mounting electrode 12 is provided on a front layer of the substrate 11. The signal conductor 13 is provided in the substrate 11. The ground conductor 141 is provided on the substrate 11 and overlaps with the signal conductor 13 when viewed in a laminating direction of the plurality of insulator layers 111 to 114 (hereinafter, merely referred to as the laminating direction) (in plan view). The ground conductor 142 is provided on the substrate 11 and overlaps with the mounting electrode 12, the signal conductor 13, and the first connecting electrode 171 in plan view. The signal conductor 13, the first connecting electrode 171, and the second connecting electrodes 172 and 173 are arranged between the ground conductor 141 and the ground conductor 142 in the laminating direction.

The signal conductor 13 is defined with respect to each signal line. The signal conductor 13 is a continuous (non-isolated) conductor pattern in one layer and has the largest area among conductor patterns that are included in the signal line and transmit signals.

The first connecting electrode 171 electrically connects the mounting electrode 12 and the signal conductor 13 with each other and is located between the signal conductor 13 and the ground conductor 141 in the laminating direction. The distance between the first connecting electrode 171 and the ground conductor 142 in the laminating direction is greater than or equal to the distance between the first connecting electrode 171 and the ground conductor 141 in the laminating direction. The first inter-layer connecting conductor 161 is electrically connected between the mounting electrode 12 and the first connecting electrode 171 and is bonded to the first connecting electrode 171. The second inter-layer connecting conductor 162 is electrically connected between the signal conductor 13 and the first connecting electrode 171 and is bonded to the first connecting electrode 171. Further, the second inter-layer connecting conductor 162 does not overlap with the first inter-layer connecting conductor 161 in plan view. In other words, the first inter-layer connecting conductor 161 and the second inter-layer connecting conductor 162 are not linearly aligned in the laminating direction. The ground conductor 141 does not overlap with the first connecting electrode 171 in plan view.

The second connecting electrodes 172 and 173 electrically connect the ground conductor 141 and the ground conductor 142 with each other. The first connecting electrode 171 does not overlap with the second connecting electrodes 172 and 173 in plan view.

When viewed in a direction that is orthogonal to an extending direction of the first connecting electrode 171 and is orthogonal to the laminating direction, the inter-layer connecting conductors 163 to 165 of the connecting portion 152 do not overlap with the first inter-layer connecting conductor 161 and the second inter-layer connecting conductor 162 of the connecting portion 151.

The insulator layers 111 to 114 are arranged in this order from the upper side to the lower side. The insulator layers 111 to 114 are made of thermoplastic resin such as liquid crystal polymer (LCP), but may be made of other insulating materials. The insulator layers 111 to 114 are integrated by, for example, heat pressing, but may be bonded to each other with an adhesive.

In the specification of the present application, the terms "upper side" and "lower side" are used for convenience to distinguish one side from the other side, but are not limiting. Similarly, the terms "upper surface" and "lower surface" are used for convenience to distinguish a main surface on one side from a main surface on the other side, but are not limiting.

The mounting electrode 12 and the ground conductor 141 are provided on the first main surface S1 of the substrate 11, that is, on an upper surface of the insulator layer 111. The first connecting electrode 171 and the second connecting electrode 172 are provided on an upper surface of the insulator layer 112. The signal conductor 13 and the second connecting electrode 173 are provided on an upper surface of the insulator layer 113. The ground conductor 142 is provided on a second main surface S2, which is on the opposite side to the first main surface S1, of the substrate 11, that is, on a lower surface of the insulator layer 114. The mounting electrode 12, the signal conductor 13, the ground conductors 141 and 142, and the connecting electrode 17 are conductor patterns and are formed by patterning a Cu foil, for example.

The first inter-layer connecting conductor 161 and the inter-layer connecting conductor 163 are provided in the insulator layer 111. The second inter-layer connecting conductor 162 and the inter-layer connecting conductor 164 are provided in the insulator layer 112. The inter-layer connecting conductor 165 is provided in the insulator layers 113 and 114. The inter-layer connecting conductors 16 are formed, for example, by solidifying an electrical paste filled in through holes of the insulator layers 111 to 114.

The signal conductor 13 extends in the same direction as the extending direction of the transmission line 10 and is located between the ground conductors 141 and 142 that are opposed to each other. A stripline structure is thus provided.

The ground conductor 141 includes a slit SL1. The slit SL1 has a rectangular shape, but may have another shape. The mounting electrode 12 and the first connecting electrode 171 are located in the slit SL1 in plan view. The slit SL1 preferably extends along the extending direction of the first connecting electrode 171 so as to improve signal characteristics.

Here, a plurality of slits SL1 are separately provided in the ground conductor 141, but some or all of the slits SL1 may be connected with each other.

Figure 4:
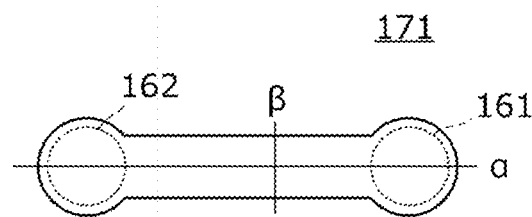
FIG. 4 is a plan view of a first connecting electrode 171 according to the first preferred embodiment of the present invention.

FIG. 4 is a plan view of the first connecting electrode 171 according to the first preferred embodiment. FIG. 4 more specifically illustrates the shape of the first connecting electrode 171 than FIG. 3. FIG. 4 shows the positions of the first inter-layer connecting conductor 161 and the second inter-layer connecting conductor 162, and also shows a direction α of a straight line connecting the position of the first inter-layer connecting conductor 161 with the position of the second inter-layer connecting conductor 162 and a direction β that is orthogonal to the direction α. The first connecting electrode 171 includes a portion bonded to the first inter-layer connecting conductor 161, a portion bonded to the second inter-layer connecting conductor 162, and a portion extending between the above two portions.

Here, the width of the first connecting electrode, the width of the signal conductor, and the width of the mounting electrode will be described. The width of the first connecting electrode is the length of the first connecting electrode in a direction orthogonal to the direction of the straight line connecting the position of the first inter-layer connecting conductor with the position of the second inter-layer connecting conductor, in plan view. The width of the signal conductor is the length of the signal conductor in a direction orthogonal to the extending direction of the signal conductor, in plan view. The width of the mounting electrode is the length of the mounting electrode in a direction orthogonal to the direction of the straight line connecting the position of the inter-layer connecting conductor bonded to the mounting electrode and the position of the connection terminal bonded to the mounting electrode, in plan view.

Figure 5A:
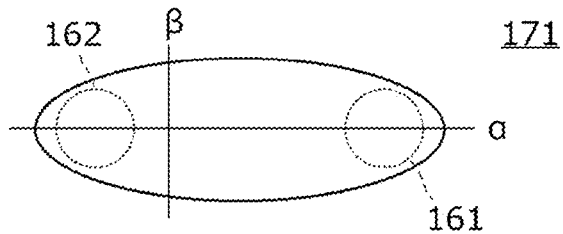
FIGS. 5A to 5E are plan views of the first connecting electrode 171 according to a modification of the first preferred embodiment of the present invention.
Figure 5B:
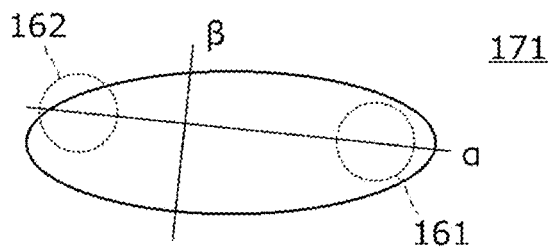
Figure 5C:
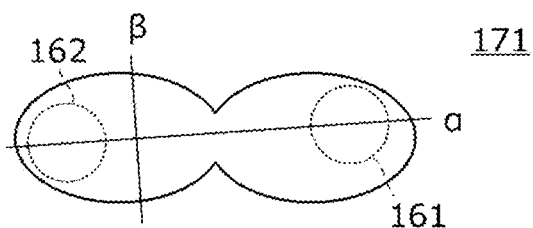
Figure 5D:
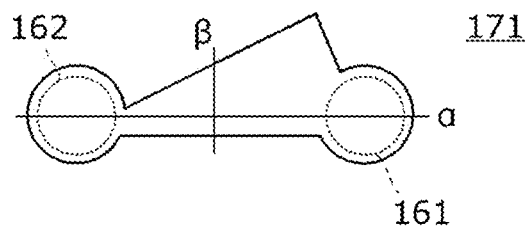
Figure 5E:
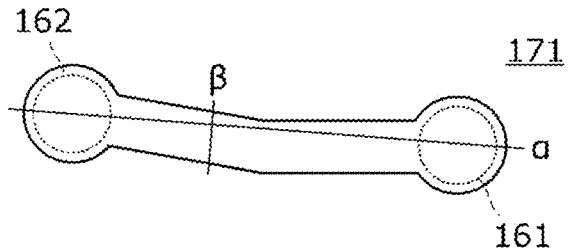

FIGS. 5A to 5E are plan views of the first connecting electrode 171 according to a modification of the first preferred embodiment. FIGS. 5A to 5E show the positions of the first inter-layer connecting conductor 161 and the second inter-layer connecting conductor 162, and also show the direction α of the straight line connecting the position of the first inter-layer connecting conductor 161 with the position of the second inter-layer connecting conductor 162 and the direction β that is orthogonal to the direction α. The first connecting electrode 171 may have the larger width at its central portion in the direction α, as illustrated in FIG. 5A. The first inter-layer connecting conductor 161 or the second inter-layer connecting conductor 162 may protrude from the first connecting electrode 171 in plan view, as illustrated in FIG. 5B. The first connecting electrode 171 may be constricted at its central portion in the direction α, as illustrated in FIG. 5C. The first connecting electrode 171 may have a protrusion portion that is not bonded to either the first inter-layer connecting conductor 161 or the second inter-layer connecting conductor 162, as illustrated in FIG. 5D. The first connecting electrode 171 may be bent in the middle of its extending direction, as illustrated in FIG. 5E.

Description will now be provided on a modification of the connecting portion 151 in a configuration in which the substrate 11 includes three or more insulator layers between the mounting electrode 12 and the signal conductor 13.

The connecting portion 151 may include one first connecting electrode and two or more inter-layer connecting conductors. The connecting portion 151 may also include a plurality of first connecting electrodes and three or more inter-layer connecting conductors. In this configuration, some of the inter-layer connecting conductors of the connecting portion 151 may overlap with each other in plan view. Also, the connecting portion 151 may include an inter-layer connecting conductor extending across a plurality of insulator layers or may include a plurality of inter-layer connecting conductors that are linearly aligned in the laminating direction.

For example, when the substrate 11 includes three layers between the mounting electrode 12 and the signal conductor 13, the connecting portion 151 may include one first connecting electrode, one inter-layer connecting conductor extending across one layer, and one inter-layer connecting conductor extending across two layers. Alternatively, the connecting portion 151 may include one first connecting electrode, two inter-layer connecting conductors that are linearly aligned with each other, and one inter-layer connecting conductor that is not linearly aligned with the above two inter-layer connecting conductors. Alternatively, the connecting portion 151 may include two first connecting electrodes and three inter-layer connecting conductors.

Even when the substrate 11 includes three or more insulator layers between the mounting electrode 12 and the signal conductor 13, the connecting portion 151 may have at least one first connecting electrode. That is, it is enough that the first inter-layer connecting conductor and the second inter-layer connecting conductor do not overlap with each other in the laminating direction. Accordingly, flatness of the mounting electrode 12 is improved as described later.

However, an inter-layer connecting conductor that is physically connected with the mounting electrode 12 and is provided directly under the mounting electrode 12 largely affects the flatness of the mounting electrode 12. In a similar manner, an inter-layer connecting conductor that is connected with the inter-layer connecting conductor, which is provided directly under the mounting electrode 12, via one first connecting electrode sometimes largely affects the flatness of the mounting electrode 12. Therefore, these inter-layer connecting conductors preferably do not overlap with any other inter-layer connecting conductors in the substrate 11. Further, it is preferable that these inter-layer connecting conductors do not extend across a plurality of insulator layers or are not linearly aligned with other inter-layer connecting conductors.

When the connecting portion 151 includes a plurality of connecting electrodes and three or more inter-layer connecting conductors, the connecting portion 151 may have a stepped shape, a zigzag shape, or another shape.

The inter-layer connecting conductors 163 and 164 do not overlap with each other in plan view. On the other hand, the inter-layer connecting conductors 163 and 165 overlap with each other in plan view. The connecting portion 152 thus has a zigzag shape, but may have a stepped shape or another shape.

The connecting portions 151 and 152 are arranged with an interval in the width direction of the transmission line 10 so as to correspond to the arrangement of the connection terminals 21 and 22 of the electronic component 20. The connecting portion 152 is positioned to be closer to the electronic component 20 than the connecting portion 151 or is positioned to overlap with the electronic component 20, in plan view.

The resist film 191 is provided on the first main surface S1 of the substrate 11. A resist film 192 is provided on the second main surface S2 of the substrate 11. The resist films 191 and 192 cover conductor patterns on the surfaces of the substrate 11. However, an opening for exposing a portion of the mounting electrode 12 and an opening for exposing a portion of the ground conductor 141 are provided on the resist film 191.

The electronic component 20 is structured so that the connection terminals 21 and 22 thereof are aligned in the width direction of the transmission line 10. The connection terminal 21 is connected to the mounting electrode 12, which is exposed from the opening of the resist film 191, with solder 231 interposed therebetween. The connection terminal 22 is connected to the ground conductor 141, which is exposed from the opening of the resist film 191, with solder interposed therebetween. The electronic component 20 is an electronic component including a signal terminal such as a connector and an IC.

Design parameters of the transmission line are determined as appropriate so as to be able to obtain desired characteristics. Specific non-limiting examples of the design parameters of the transmission line will be shown below.

Layer thickness T1 of insulator layer: 50 μm
Thickness T2 of conductor pattern: 12 μm
Minimum width W1 of first connecting electrode and minimum width W3 of signal conductor: from 60 μm to 100 μm inclusive
Interval D1 between mounting electrode and ground conductor: 40 μm or greater When the width of the connecting electrode is set to be smaller than that of the signal conductor, the minimum width W1 of the connecting electrode is set as W3-20 μm or greater and W3-10 μm or smaller, for example. Further, the conductor pattern is actually buried in the insulator layer for about 1 μm to about 2 μm, for example.

According to the first preferred embodiment, the first connecting electrode 171 is closer to the ground conductor 141 than the signal conductor 13 in the laminating direction, but does not overlap with the ground conductor 141 in plan view. This configuration prevents an excessive capacitance value between the first connecting electrode 171 and the ground conductor 141 compared to the capacitance value between the signal conductor 13 and the ground conductor 141. This reduces or prevents deviation of the characteristic impedance in the first region Z1 of the transmission line 10 from the characteristic impedance in the second region Z2 of the transmission line 10.

If the inter-layer connecting conductors 16 that are harder than a resin sheet are linearly aligned in forming the substrate 11 by thermo-compression bonding of resin sheets, the surface of the substrate 11 may be protruded on forming positions of the inter-layer connecting conductors 16. According to the first preferred embodiment, the first inter-layer connecting conductor 161 and the second inter-layer connecting conductor 162 are not linearly aligned, thus reducing or preventing degradation in flatness of the mounting electrode 12. As a result, a favorable connection between the mounting electrode 12 and the electronic component 20 can be obtained.

When viewed in the direction that is orthogonal to the extending direction of the first connecting electrode 171 and is orthogonal to the laminating direction (the width direction of the transmission line 10), the inter-layer connecting conductors 163 to 165 of the connecting portion 152 do not overlap with the first inter-layer connecting conductor 161 and the second inter-layer connecting conductor 162 of the connecting portion 151. Therefore, even if the interval between the connection terminals 21 and 22 of the electronic component 20 is small, the interval between the first and second inter-layer connecting conductors 161 and 162 of the connecting portion 151 and the inter-layer connecting conductors 163 to 165 of the connecting portion 152 is secured. This reduces or prevents capacitance coupling between the first and second inter-layer connecting conductors 161 and 162 of the connecting portion 151 and the inter-layer connecting conductors 163 to 165 of the connecting portion 152.

Further, the first connecting electrode 171 does not overlap with the second connecting electrodes 172 and 173 in plan view. This reduces or prevents capacitance coupling between the first connecting electrode 171 and the second connecting electrodes 172 and 173.

Furthermore, the first inter-layer connecting conductor 161, the second inter-layer connecting conductor 162, and the inter-layer connecting conductors 163 to 165 are not linearly aligned, and are connected with each other via the first connecting electrode 171 and the second connecting electrodes 172 and 173. Therefore, the first connecting electrode 171 and second connecting electrodes 172 and 173 that are easily deformable are bent in response to bending of the transmission line 10, thus maintaining bendability of the transmission line 10.

Figure 6:
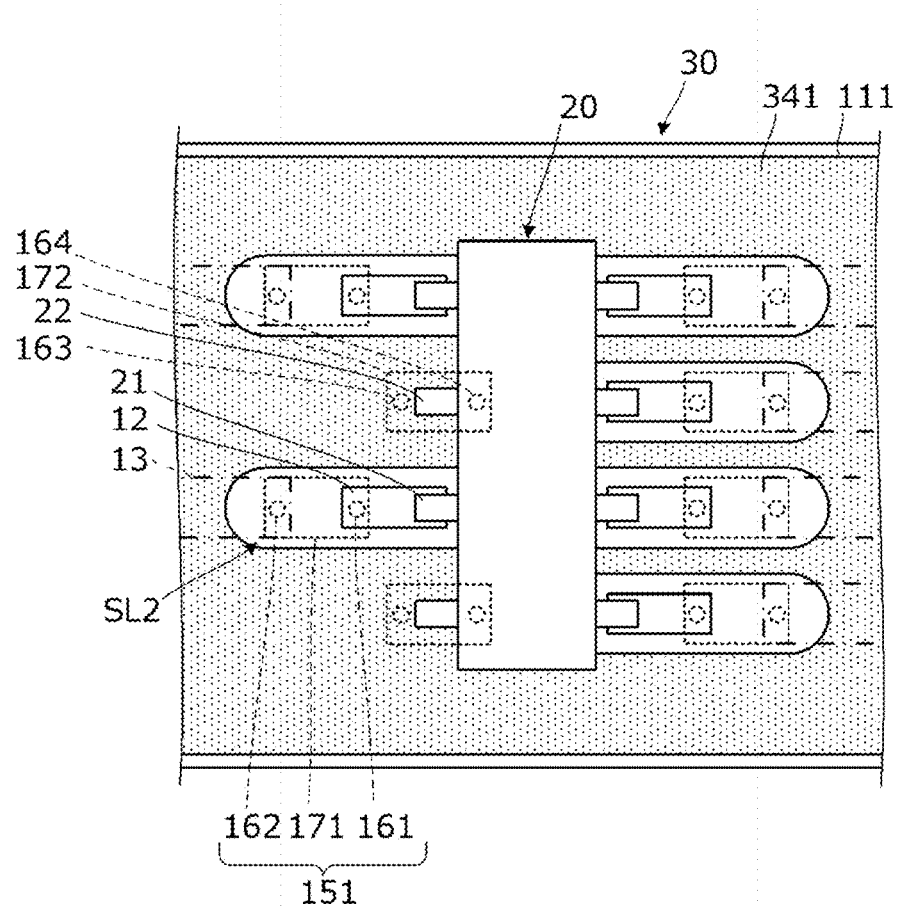
FIG. 6 is a plan view of a main portion of a transmission line 30 according to another modification of the first preferred embodiment of the present invention.

FIG. 6 is a plan view of a main portion of a transmission line 30 according to another modification of the first preferred embodiment. The transmission line 30 differs from the transmission line 10 on the following point. Namely, the transmission line 30 includes a ground conductor 341 including a slit SL2, instead of the ground conductor 141 including the slit SL1. The slit SL2 is arc-shaped or rounded at an end portion closer to the first connecting electrode 171.

The end portion of the slit is thus changed from a rectangular shape into an arc shape, being able to increase the interval between the first connecting electrode 171 and the ground conductor in the extending direction of the first connecting electrode 171 without increasing the area of the slit. Accordingly, the capacitance coupling between the first connecting electrode 171 and the ground conductor can be further reduced or prevented without increasing radiation noise from the slit.

The slit may be circular so as to increase the interval between the first connecting electrode 171 and the ground conductor. However, when the slit is circular, the width of the slit is increased. Therefore, when the interval between the connection terminals 21 and 22 of the electronic component 20 is small, a slit including an arc-shaped end portion is more preferable than a circular slit.

Figure 7:
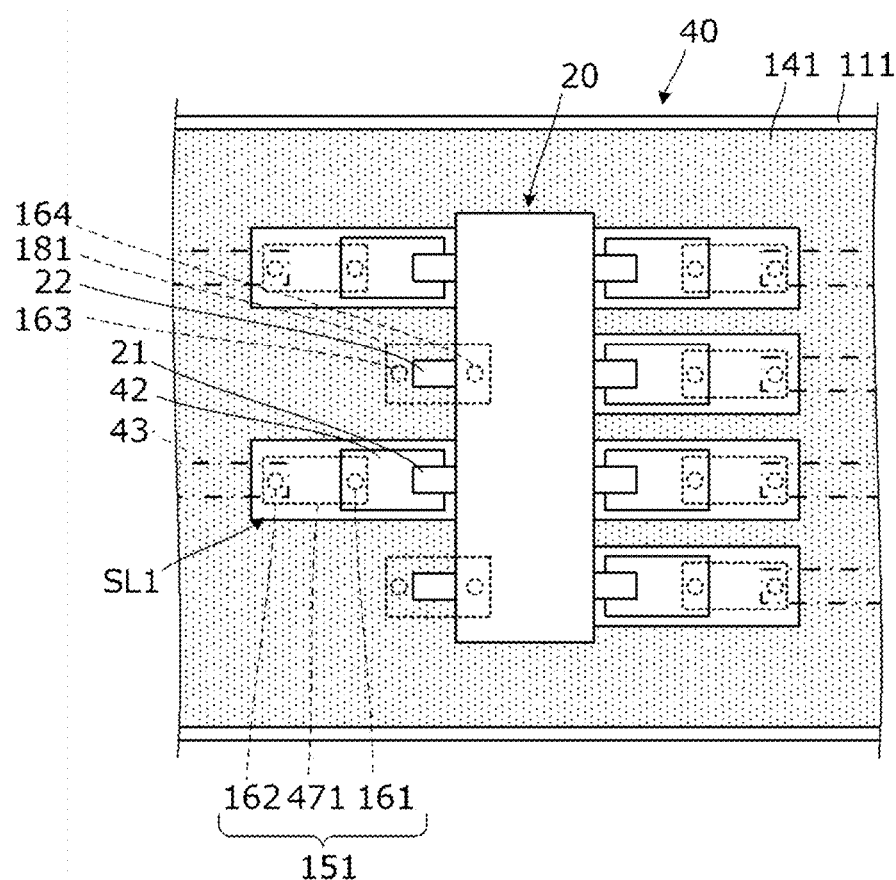
FIG. 7 is a plan view of a main portion of a transmission line 40 according to still another modification of the first preferred embodiment of the present invention.

FIG. 7 is a plan view of a main portion of a transmission line 40 according to still another modification of the first preferred embodiment. The transmission line 40 differs from the transmission line 10 on the following point. Namely, the transmission line 40 includes a mounting electrode 42, a signal conductor 43, and a first connecting electrode 471, instead of the mounting electrode 12, the signal conductor 13, and the first connecting electrode 171.

Figure 8:
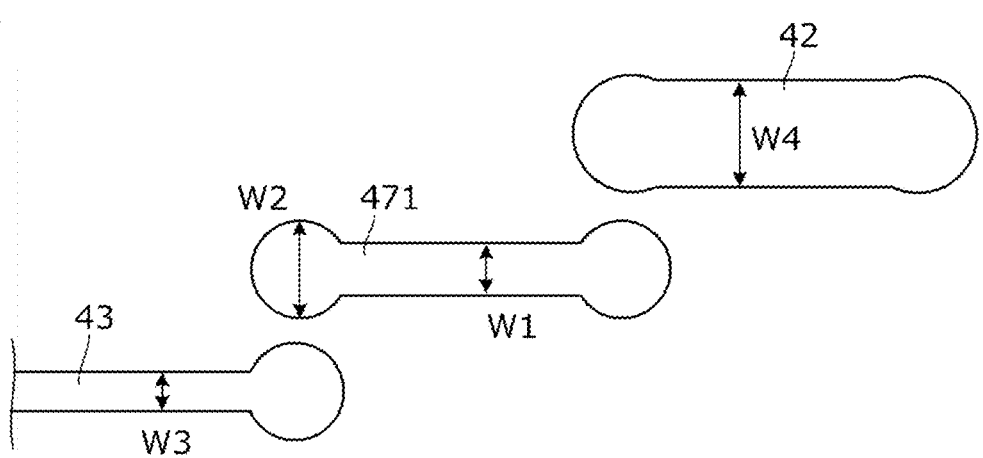
FIG. 8 is a plan view of a mounting electrode 42, a signal conductor 43, and a first connecting electrode 471.

FIG. 8 is a plan view of the mounting electrode 42, the signal conductor 43, and the first connecting electrode 471. FIG. 8 illustrates the mounting electrode 42, the signal conductor 43, and the first connecting electrode 471 in such a manner that positions of these three are shifted from each other. The minimum width W1 of the first connecting electrode 471 is larger than the minimum width W3 of the signal conductor 43. The maximum width W2 of the first connecting electrode 471 is smaller than the minimum width W4 of the mounting electrode 42.

Conductor loss at the first connecting electrode is reduced or prevented by setting the minimum width W1 of the first connecting electrode larger than the minimum width W3 of the signal conductor.

Second Preferred Embodiment

In a second preferred embodiment, a first connecting electrode includes a first portion that overlaps with a ground conductor on the upper surface side of a substrate, and a second portion that does not overlap with the ground conductor on the upper surface side of the substrate, in plan view.

Figure 9:
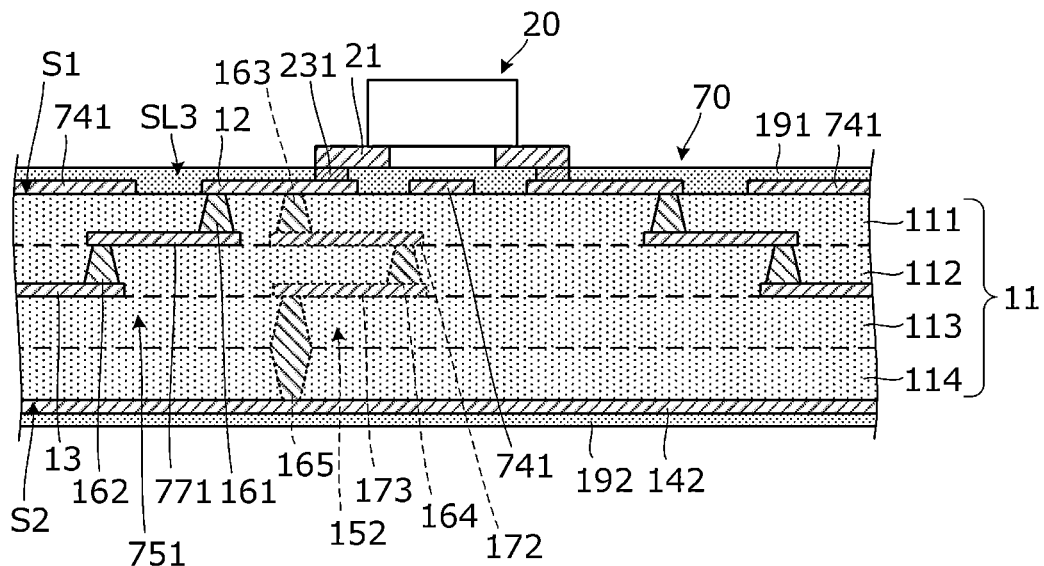
FIG. 9 is a sectional view of a transmission line 70 according to a second preferred embodiment of the present invention.
Figure 10:
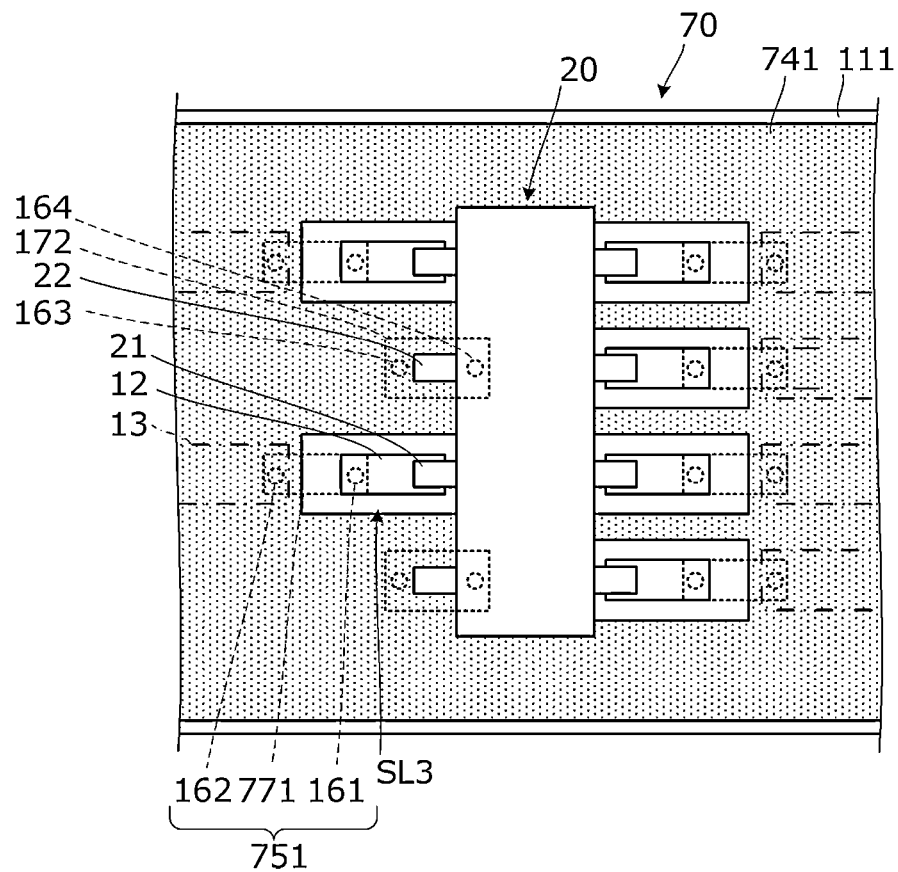
FIG. 10 is a plan view of a main portion of the transmission line 70.

FIG. 9 is a sectional view of a transmission line 70 according to the second preferred embodiment of the present invention. FIG. 10 is a plan view of a main portion of the transmission line 70. FIG. 10 omits the illustration of the resist film 191.

The transmission line 70 differs from the transmission line 10 according to the first preferred embodiment on the following point. Namely, the transmission line 70 includes a ground conductor 741 including a slit SL3, instead of the ground conductor 141 including the slit SL1. Further, the transmission line 70 includes a connecting portion 751 including a first connecting electrode 771, instead of the connecting portion 151 having the first connecting electrode 171. The length of the slit SL3 is shorter than the length of the slit SL1 and the first connecting electrode 771 partially overlaps with the ground conductor 741 in plan view. The minimum width W1 of the first connecting electrode 771 is smaller than the minimum width W3 of the signal conductor 13.

Figure 11:
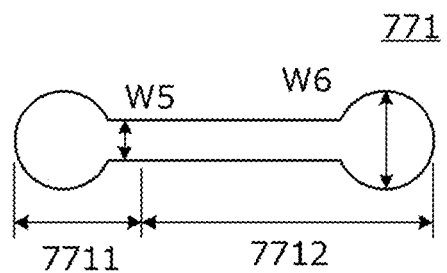
FIG. 11 is a plan view of a first connecting electrode 771.

FIG. 11 is a plan view of the first connecting electrode 771. FIG. 11 more specifically illustrates the shape of the first connecting electrode 771 than FIG. 10. The first connecting electrode 771 includes a first portion 7711 that overlaps with the ground conductor 741 and a second portion 7712 that does not overlap with the ground conductor 741 in plan view. The minimum width W5 of the first portion 7711 is smaller than the maximum width W6 of the second portion 7712. An area of the first portion 7711 is smaller than an area of the second portion 7712.

Figure 12A:
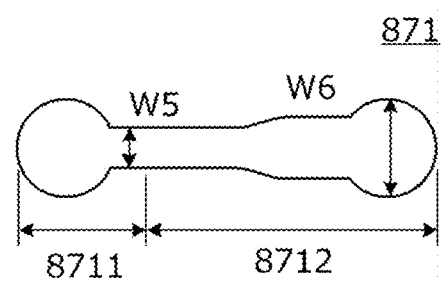
FIGS. 12A and 12B are plan views of first connecting electrodes 871 and 971 according to a modification of the second preferred embodiment of the present invention.
Figure 12B:
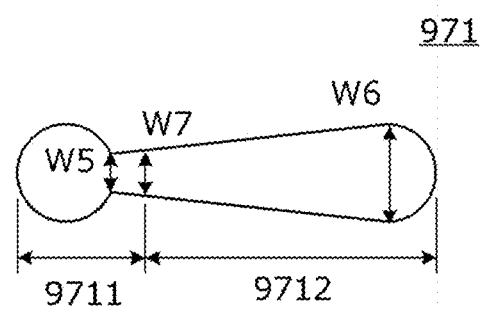

FIGS. 12A and 12B are plan views of first connecting electrodes 871 and 971 according to a modification of the second preferred embodiment. The transmission line 70 may include the first connecting electrode 871 illustrated in FIG. 12A or the first connecting electrode 971 illustrated in FIG. 12B, instead of the first connecting electrode 771.

The first connecting electrode 871 includes a first portion 8711 that overlaps with the ground conductor 741 and a second portion 8712 that does not overlap with the ground conductor 741 in plan view. The width of the first connecting electrode 871 changes in the middle of its extending direction. The minimum width W5 of the first portion 8711 is smaller than the maximum width W6 of the second portion 8712. An area of the first portion 8711 is smaller than an area of the second portion 8712.

The first connecting electrode 971 includes a first portion 9711 that overlaps with the ground conductor 741 and a second portion 9712 that does not overlap with the ground conductor 741 in plan view. The minimum width W5 of the first portion 9711 is smaller than the maximum width W6 of the second portion 9712. The minimum width W5 of the first portion 9711 is smaller than the minimum width W7 of the second portion 9712. An area of the first portion 9711 is smaller than an area of the second portion 9712.

In the second preferred embodiment, the ground conductor 741 extends up to immediately before the mounting electrode 12 in the extending direction of the transmission line 70. Therefore, superimposition of external noise on a high-frequency signal is prevented until immediately before the high-frequency signal is outputted from the transmission line 70. The intensity of electric field is stronger especially at a position on which the second inter-layer connecting conductor 162, raising a signal line of the transmission line 70 in the laminating direction, is positioned, than other positions. In the second preferred embodiment, this position is covered by the ground conductor 741 and accordingly, superimposition of external noise on a high-frequency signal is effectively prevented.

Also, noise radiation from the slit SL3 is further reduced or prevented.

Furthermore, the first connecting electrodes 771, 871, and 971 are positioned so that each of the first connecting electrodes 771, 871, and 971 overlaps with the ground conductor 741 in plan view but each has a smaller area facing the ground conductor 741. This reduces or prevents an increase in a capacitance value between the first connecting electrode 771, 871, or 971 and the ground conductor 741 and consequently reduces or prevents a deviation of the characteristic impedance of the transmission line 70.

Other Preferred Embodiments

FIGS. 13, 14, 15, 16, and 17 are sectional views of transmission lines according to other preferred embodiments. In order to avoid unwanted conduction, coupling, or interference with an electronic component or wiring mounted in the substrate 11, for example, the connecting portion 151 may detour to the second main surface S2 side, as illustrated in FIGS. 13 to 17. In this configuration, the first connecting electrode 171 is between the signal conductor 13 and the ground conductor 142. The ground conductor 142 is partially removed and does not overlap with at least a portion of the first connecting electrode 171. This configuration reduces or prevents capacitance coupling between the first connecting electrode 171 and the ground conductor 142.

Here, FIGS. 13 to 17 omit illustration of electronic components and wiring mounted in the substrate 11 described above.

Figure 13:
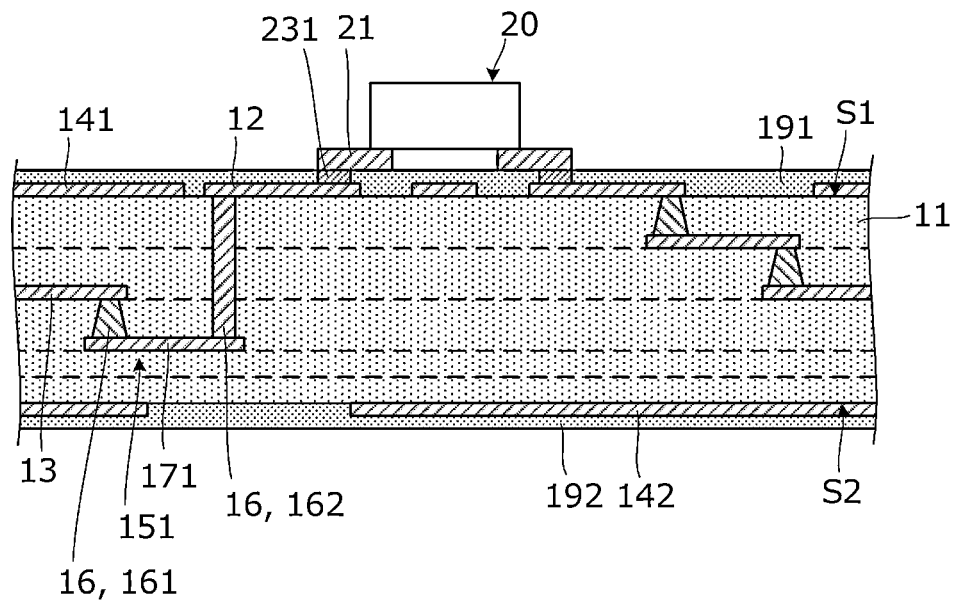
FIG. 13 is a sectional view of a transmission line according to another preferred embodiment of the present invention.
Figure 14:
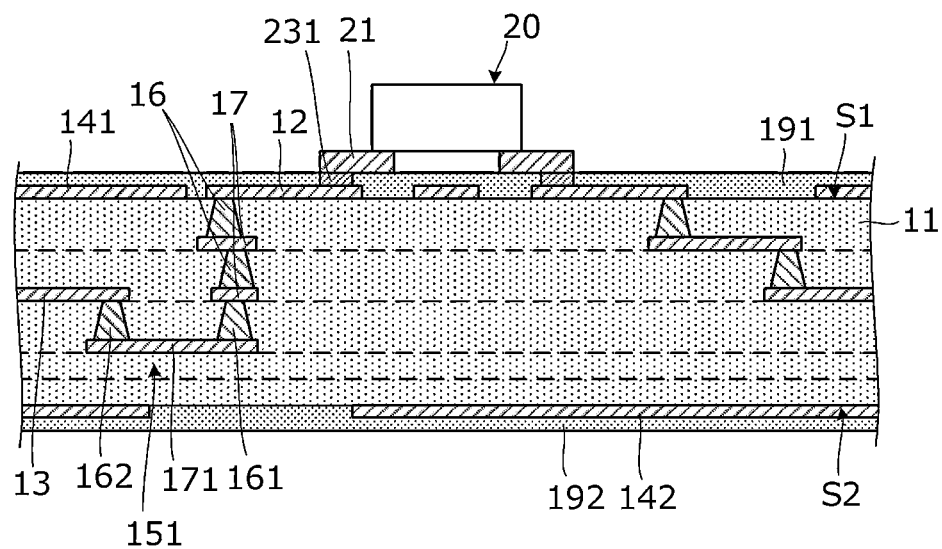
FIG. 14 is a sectional view of a transmission line according to still another preferred embodiment of the present invention.
Figure 15:
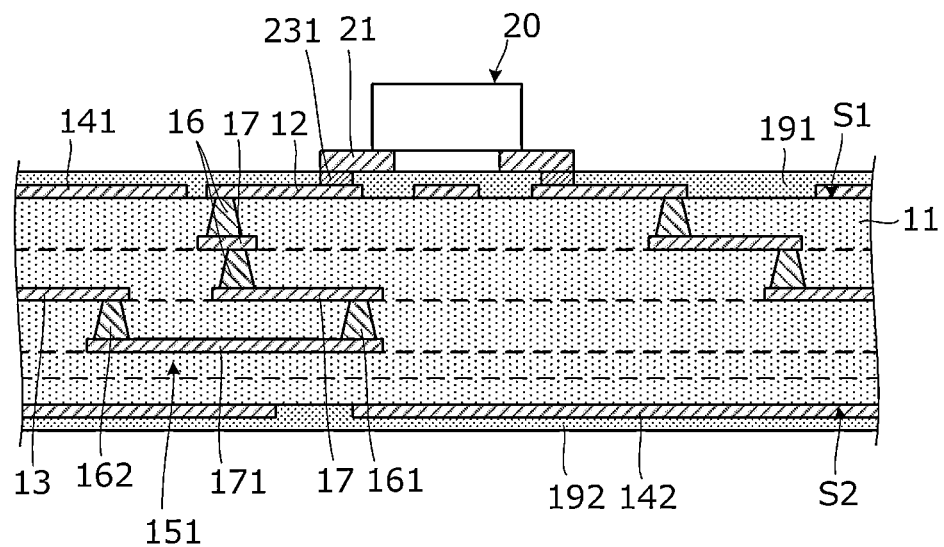
FIG. 15 is a sectional view of a transmission line according to yet another preferred embodiment of the present invention.
Figure 17:
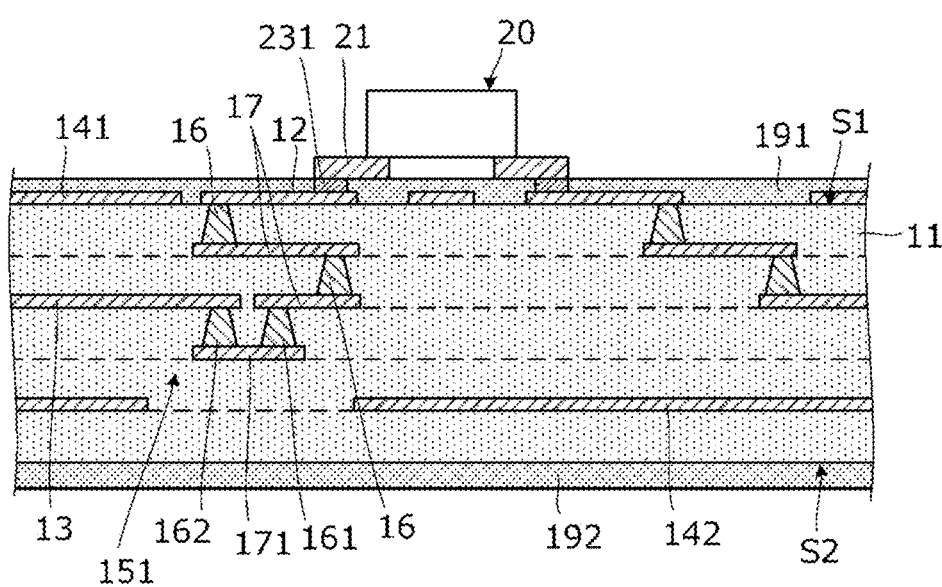
FIG. 17 is a sectional view of a transmission line according to yet another preferred embodiment of the present invention.
Figure 18:
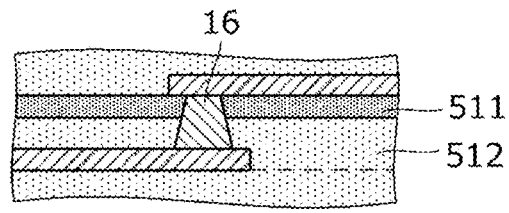
FIG. 18 is a sectional view illustrating a portion of a transmission line according to yet another preferred embodiment of the present invention.

The inter-layer connecting conductor 16 may be a via hole that penetrates through a plurality of layers, as illustrated in FIG. 13. Further, one inter-layer connecting conductor 16 may penetrate through a plurality of insulator layers 511 and 512 that respectively include mutually-different kinds of resin sheets, as illustrated in FIG. 18. The connecting portion 151 may include three or more inter-layer connecting conductors 16 and a plurality of connecting electrodes 17, as illustrated in FIGS. 14 to 17. The connecting portion 151 may include the inter-layer connecting conductors 16 that overlap with each other in plan view, as illustrated in FIG. 17. Further, the ground conductor 142 may be provided on an inner layer, as illustrated in FIG. 17.

Figure 16:
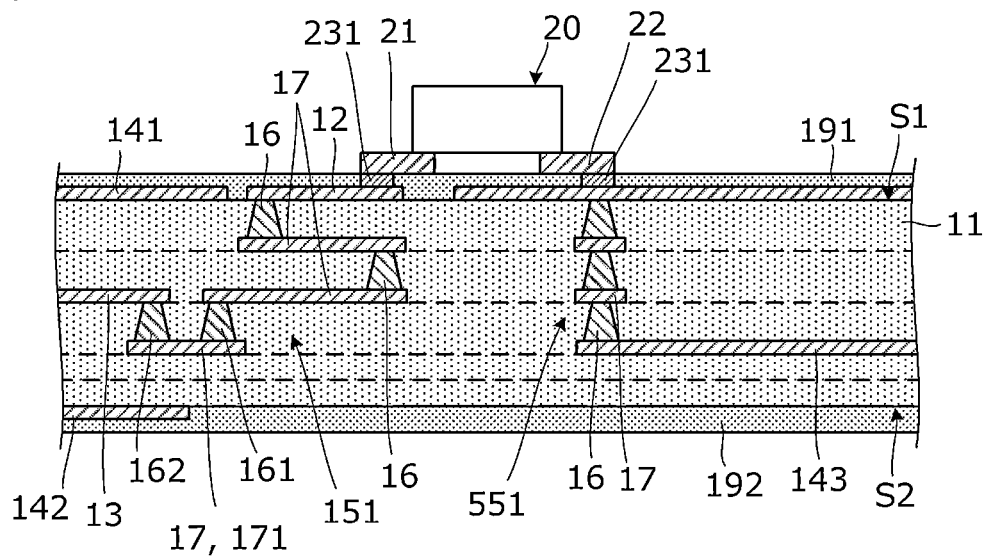
FIG. 16 is a sectional view of a transmission line according to yet another preferred embodiment of the present invention.

The connecting electrodes 17 of the connecting portion 151 do not overlap with a connecting portion 551 that connects the ground conductor 141 and a ground conductor 143 with each other, in plan view, as illustrated in FIG. 16. Thus, it is preferable that the connecting electrode 17 of the connecting portion 151 does not overlap with a wiring portion connected to the ground, in plan view. This reduces or prevents capacitance coupling between the connecting electrode 17 of the connecting portion 151 and the wiring portion.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A transmission line comprising:
    a substrate including a plurality of insulator layers;
    a mounting electrode on a front layer of the substrate;
    a signal conductor in the substrate;
    a first ground conductor that is provided on the substrate and overlaps with the signal conductor when viewed in a laminating direction of the plurality of insulator layers;
    a first connecting electrode that electrically connects the mounting electrode and the signal conductor with each other and is between the signal conductor and the first ground conductor in the laminating direction;
    a first inter-layer connecting conductor that is electrically connected between the mounting electrode and the first connecting electrode and is bonded to the first connecting electrode; and
    a second inter-layer connecting conductor that is electrically connected between the signal conductor and the first connecting electrode, is bonded to the first connecting electrode, and does not overlap with the first inter-layer connecting conductor when viewed in the laminating direction;
    wherein
    the first ground conductor does not overlap with at least a portion of the first connecting electrode when viewed in the laminating direction.

2. The transmission line according to claim 1, wherein the first ground conductor does not overlap with the first connecting electrode when viewed in the laminating direction.

3. The transmission line according to claim 2, further comprising:
    a second ground conductor on the substrate and overlapping with the first connecting electrode when viewed in the laminating direction; wherein
    the signal conductor and the first connecting electrode are between the first ground conductor and the second ground conductor in the laminating direction;
    a distance between the first connecting electrode and the second ground conductor in the laminating direction is greater than or equal to a distance between the first connecting electrode and the first ground conductor in the laminating direction; and
    a minimum width of the first connecting electrode is larger than a minimum width of the signal conductor.

4. The transmission line according to claim 2, further comprising:
    a second ground conductor on the substrate and overlapping with the first connecting electrode and the mounting electrode when viewed in the laminating direction; wherein
    the signal conductor and the first connecting electrode are between the first ground conductor and the second ground conductor and between the mounting electrode and the second ground conductor in the laminating direction;
    a distance between the first connecting electrode and the second ground conductor in the laminating direction is greater than or equal to a distance between the first connecting electrode and the first ground conductor in the laminating direction; and
    a maximum width of the first connecting electrode is smaller than a minimum width of the mounting electrode.

5. The transmission line according to claim 1, wherein
    the first connecting electrode includes a first portion that overlaps with the first ground conductor and a second portion that does not overlap with the first ground conductor when viewed in the laminating direction; and
    a minimum width of the first portion is smaller than a maximum width of the second portion.

6. The transmission line according to claim 5, wherein the minimum width of the first portion is smaller than a minimum width of the second portion.

7. The transmission line according to claim 1, wherein
    the first connecting electrode includes a first portion that overlaps with the first ground conductor and a second portion that does not overlap with the first ground conductor when viewed in the laminating direction; and
    an area of the first portion is smaller than an area of the second portion.

8. The transmission line according to claim 5, wherein a minimum width of the first connecting electrode is smaller than a minimum width of the signal conductor.

9. The transmission line according to claim 1, further comprising:
    a second ground conductor on the substrate and overlapping with the first connecting electrode when viewed in the laminating direction; and
    a second connecting electrode that electrically connects the first ground conductor and the second ground conductor with each other; wherein
    the signal conductor, the first connecting electrode, and the second connecting electrode are between the first ground conductor and the second ground conductor in the laminating direction;
    a distance between the first connecting electrode and the second ground conductor in the laminating direction is greater than or equal to a distance between the first connecting electrode and the first ground conductor in the laminating direction; and
    the first connecting electrode and the second connecting electrode do not overlap with each other when viewed in the laminating direction.

10. The transmission line according to claim 1, wherein the signal conductor includes a continuous conductor pattern in one of the plurality of insulator layers and has a largest area among conductor patterns that define signal lines and transmit signals.

11. The transmission line according to claim 3, wherein the signal conductor extends in a same direction that the transmission line extends, and the signal conductor is arranged between the first ground conductor and the second ground conductor to define a stripline structure.

12. The transmission line according to claim 1, wherein the first ground conductor includes at least one slit with a shape that is rectangular, circular, or arc-shaped, or includes an arc-shaped end portion.

13. The transmission line according to claim 12, wherein the mounting electrode and the first connecting electrode are located in the at least one slit.

14. The transmission line according to claim 1, wherein at least three of the plurality of insulator layers are provided between the mounting electrode and the signal conductor.

15. The transmission line according to claim 1, further comprising a third inter-layer connecting conductor that overlaps with one of the first inter-layer connecting conductor and the second inter-layer connecting conductor.

16. The transmission line according to claim 1, further comprising at least one resist film on at least one main surface of the substrate.

17. The transmission line according to claim 16, wherein the at least one resist film includes an opening to expose a portion of the mounting electrode and an opening to expose a portion of the first ground conductor.

18. The transmission line according to claim 1, wherein the first connecting electrode is closer to the ground conductor than the signal conductor in the laminating direction.

19. The transmission line according to claim 1, wherein the ground conductor extends up to immediately before the mounting electrode in an extending direction of the transmission line.

20. The transmission line according to claim 1, wherein the first inter-layer connecting conductor or the second inter-layer connecting conductor is a via hole.

* * * * *